United States Patent
Tsuji et al.

(10) Patent No.: US 7,799,134 B2
(45) Date of Patent: Sep. 21, 2010

(54) SHOWER PLATE HAVING PROJECTIONS AND PLASMA CVD APPARATUS USING SAME

(75) Inventors: Naoto Tsuji, Tama (JP); Hideaki Fukuda, Tama (JP); Hiroki Arai, Tama (JP); Yoshinori Morisada, Tama (JP); Tamihiro Kobayashi, Tama (JP)

(73) Assignee: ASM Japan K.K., Tokyo (JP)

( * ) Notice: Subject to any disclaimer, the term of this patent is extended or adjusted under 35 U.S.C. 154(b) by 440 days.

(21) Appl. No.: 11/061,986

(22) Filed: Feb. 18, 2005

(65) Prior Publication Data

US 2005/0183666 A1 Aug. 25, 2005

(30) Foreign Application Priority Data

Feb. 20, 2004 (JP) ............... 2004-044854

(51) Int. Cl.
*H01L 21/00* (2006.01)
(52) U.S. Cl. ............. 118/715; 156/345.34; 156/345.35; 156/345.33
(58) Field of Classification Search ............ 156/345.34, 156/345.35, 345.33; 118/715
See application file for complete search history.

(56) References Cited

U.S. PATENT DOCUMENTS

| | | | |
|---|---|---|---|
| 4,854,263 A | 8/1989 | Chang et al. | |
| 5,031,571 A * | 7/1991 | Igarashi et al. | 118/723 E |
| 5,102,523 A * | 4/1992 | Beisswenger et al. | 204/298.33 |
| 5,624,498 A * | 4/1997 | Lee et al. | 118/715 |
| 6,106,663 A * | 8/2000 | Kuthi et al. | 156/345.34 |
| 6,159,297 A * | 12/2000 | Herchen et al. | 118/708 |
| 6,228,438 B1 * | 5/2001 | Schmitt | 427/569 |
| 6,245,192 B1 * | 6/2001 | Dhindsa et al. | 156/345.34 |
| 6,436,193 B1 * | 8/2002 | Kasai et al. | 118/715 |
| 6,444,039 B1 * | 9/2002 | Nguyen | 156/345.34 |
| 7,147,793 B2 * | 12/2006 | Fink | 216/71 |
| 2003/0037880 A1 | 2/2003 | Carducci et al. | 156/345.43 |
| 2003/0140851 A1 * | 7/2003 | Janakiraman et al. | 118/715 |
| 2004/0035358 A1 * | 2/2004 | Basceri et al. | 118/715 |

* cited by examiner

*Primary Examiner*—Ram N Kackar
*Assistant Examiner*—Rakesh Dhingra
(74) *Attorney, Agent, or Firm*—Knobbe, Martens, Olson & Bear LLP

(57) ABSTRACT

A shower plate 122 has protrusions 22 formed on the front face used with a first electrode in a plasma CVD apparatus. A plane-surface portion 23 is left around apertures of gas inlet holes 21 formed in the shower plate 122. With protrusions 22 being formed, a surface area of the first electrode is increased.

13 Claims, 11 Drawing Sheets

(a)

(b)

(c)

(a)

(b)

(c)

Background Art

SHOWER PLATE HAVING PROJECTIONS AND PLASMA CVD APPARATUS USING SAME

BACKGROUND OF THE INVENTION

1. Field of the Invention

The present invention generally relates to a plasma CVD apparatus used in a semiconductor manufacturing process; particularly to a shape of a shower plate provided in the plasma CVD apparatus.

2. Description of the Related Art

A conventional plasma CVD apparatus possesses a first and a second electrodes disposed parallel to each other inside a vacuum chamber; the first electrode has a hollow structure for introducing source gases into the vacuum chamber and has a shower plate removably attached in its bottom face; in the shower plate, many gas inlet holes are formed.

A conventional shower plate is disk-shaped and has many gas inlet holes of a given diameter being formed with an arrangement to be adapted to pass completely through to the reverse face of the shower plate from its front face.

Additionally, as shown in FIGS. 15(a) and (b), there is a shower plate having gas inlet holes having diameters gradually increasing to the direction of gas flow (for example, see U.S. Pat. No. 4,854,263). This shower plate has larger apertures on its forefront surface in a honeycomb-shaped surface pattern as shown in FIG. 16.

Conventional plasma CVD apparatuses have a problem in that it is difficult to form a thin film having desired properties stably with excellent controllability or reproducibility. That is, the operable ranges to produce desired films are narrow. This problem cannot be solved even by using the shower plate of U.S. Pat. No. 4,854,263.

Additionally, the shower plate of U.S. Pat. No. 4,854,263 has another problem in that its shape pattern gets to be transferred to a film thickness distribution of a thin film formed.

SUMMARY OF THE INVENTION

Consequently, in an aspect of the present invention, an object is to provide a plasma CVD apparatus which is able to form a thin film having desired properties stably with excellent controllability.

In another aspect, an object of the present invention is to provide a shower plate used in a plasma CVD apparatus, which makes it possible to form a thin film having desired properties stably with excellent controllability.

The present invention can accomplish one or more of the above-mentioned objects in various embodiments. However, the present invention is not limited to the above objects, and in embodiments, the present invention exhibits effects other than the objects.

In an embodiment, the present invention provides a shower plate for plasma CVD comprising: (i) a base surface having multiple apertures for passing a gas therethrough; and (ii) multiple protrusions each separately protruding from the base surface and being dispersed among the apertures.

In another embodiment, the present invention provides a shower plate for plasma CVD comprising: (i) a base surface; (ii) multiple protrusions protruding from the base surface, and (iii) multiple apertures for passing a gas therethrough dispersed on a front face constituted by the base surface and the protrusions, wherein a surface area of the base surface and the protrusions is greater by at least 40% than a calculated surface area of the base surface if no protrusions are provided, and wherein a surface area when extending from the base surface and the protrusions by a sheath generated by plasma exposure is nearly or substantially equal to or greater than the surface area of the base surface and the protrusions.

The present invention also includes an aspect directed to a plasma CVD apparatus comprising: (a) a reaction chamber; (b) a showerhead provided in the chamber, which serves as an electrode and comprises the shower plate described above and a body member to which the shower plate is attached; and (c) a susceptor provided in the chamber, which serves as another electrode and is disposed parallel to the shower plate.

In still another aspect, the present invention provides a plasma CVD method comprising: (1) placing a substrate on a susceptor disposed parallel to the shower plate described above; (2) introducing a reaction gas through the shower plate; (3) generating a plasma between the susceptor and the shower plate by applying radio-frequency energy therebetween, wherein a sheath is formed over the shower plate, wherein a surface area of the sheath is nearly or substantially equal to or greater than a physical surface area of the shower plate; and (4) depositing a film on the substrate.

According to at least one embodiment of the present invention, by forming a plane-surface portion surrounding the apertures of multiple gas inlet holes and protrusions protruding from the plane-surface portion on the front face of a shower plate, and using a plasma CVD apparatus using the shower plate, a thin film can be formed stably with excellent controllability.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes.

FIGS. 2(a)-(c) are a partial cross section seen from obliquely upward, a partial longitudinal cross section, and a bottom view, respectively, showing the shower plate.

FIGS. 3(a)-(c) are a partial cross section seen from obliquely upward, a partial longitudinal cross section, and a bottom view, respectively, showing the shower plate.

FIGS. 13(*a*)-(*c*) are a partial cross section seen from obliquely upward, a partial longitudinal cross section, and a bottom view, respectively, showing the shower plate.

FIG. 14(*b*) is a schematic diagram explaining an increase of surface area with a sheath formed on a concave structure.

Figure 1:
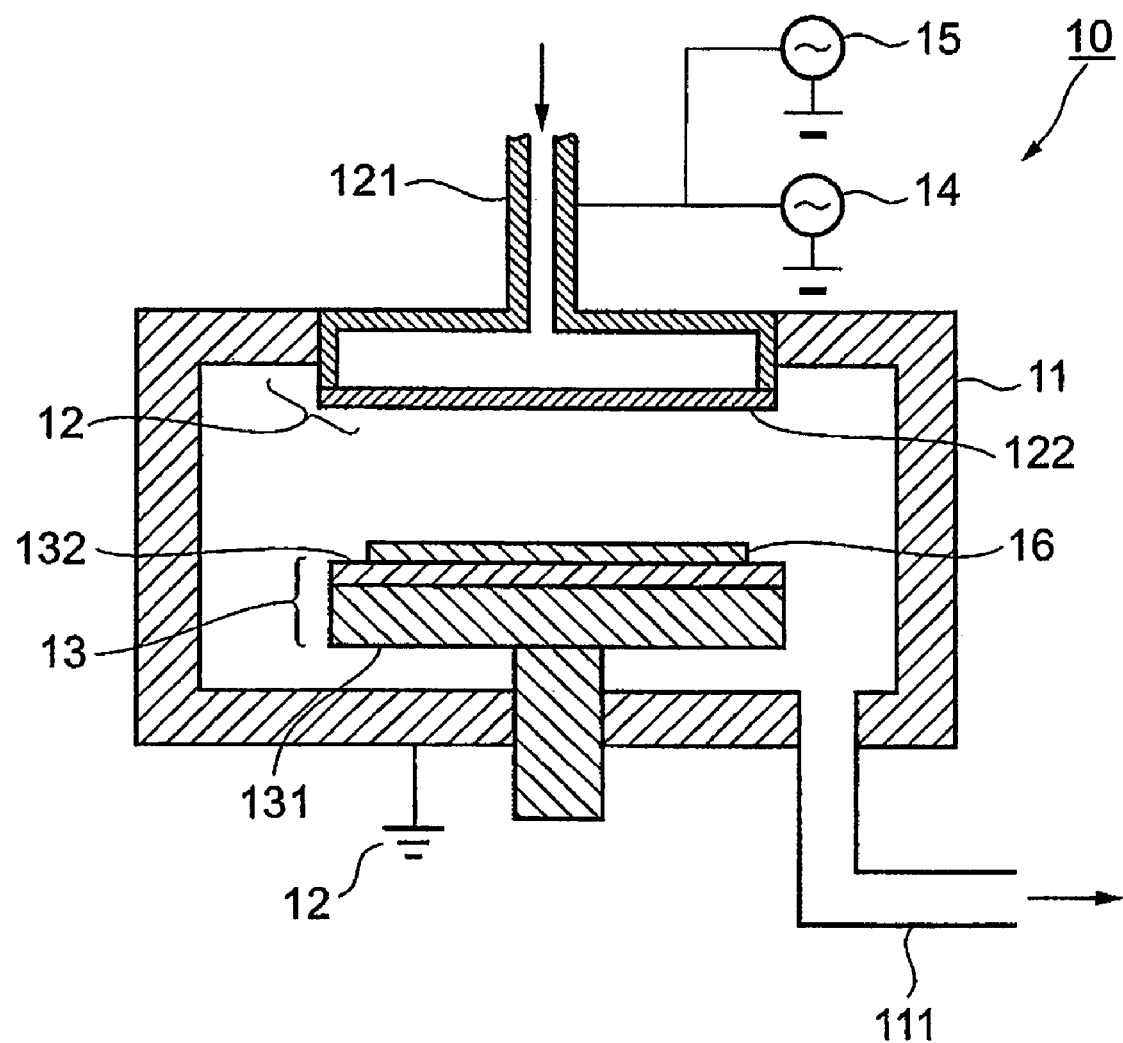
FIG. 1 is a schematic view of a plasma CVD apparatus showing a basic structure according to an embodiment of the present invention.

Explanation of symbols used in the drawings are as follows: 10: Plasma CVD apparatus; 11: Vacuum chamber; 111: Exhaust port; 12: First electrode; 121: Gas inlet port; 122: Shower plate; 13: Second electrode; 131: Heater; 132: Susceptor; 14: First RF power source; 15: Second RF power source; 16: Workpiece; 21, 21': Gas inlet holes; 22, 22': Protrusion; 23: Plane-surface portion.

DETAILED DESCRIPTION OF THE PREFERRED EMBODIMENT

As described above, in an aspect, the present invention provides a shower plate for plasma CVD comprising: (i) a base surface having multiple apertures for passing a gas therethrough; and (ii) multiple protrusions each separately protruding from the base surface and being dispersed among the apertures. The base surface may be constituted by a physical surface composed of a plane, a curved surface, or a combination thereof, or a hypothetical surface. In this embodiment, the apertures are provided in the base surface. Further, in this embodiment, the multiple protrusions each separately protrude from the base surface; e.g., the protrusions are discontinuous protrusions just like islands in an ocean, not like land having ponds.

The above embodiment includes, but is not limited to, the following embodiments:

A surface area of the base surface and the protrusions may be greater by about 20% to about 500% (including 40%, 60%, 80%, 100%, 200%, 300%, 400%, and any numbers therebetween), preferably at least 40% (more preferably 70% to 300%), than a calculated surface area of the base surface if no protrusions are provided. In the above, to calculate the surface area of the base surface, the areas of the apertures are not considered; i.e., the surface area of the base surface is calculated as if there are no apertures provided. For example, if the protrusions are hexagonal columns having a height of 3-9 mm and a width of 3 mm and provided at a pitch of 6 mm, the surface area is increased by about 72% to about 216%.

In an embodiment, a surface area when extending from the base surface and the protrusions by a sheath generated by plasma exposure may be nearly or substantially equal to or greater than the surface area of the base surface and the protrusions. A sheath is a boundary region formed in front of an electrode surface when being exposed to a plasma. In the sheath, complex behavior of ions and particles in a dropped electric potential is involved (see e.g., Brian Chapman, "Glow Discharge Processes", John Wiley & Sons, Inc., 1980, Chapter 3). The thickness of the sheath may be determined using a computer simulation (see e.g., Onoue et al., "TCAD Simulation for Virtual Design of Semiconductor Processes", Toshiba Review Vol. 58, No. 6, pp. 60-63, 2003). The sheath region is a darker region as compared with a plasma, and can be observed by eye easily. Typically, a sheath having a thickness of about 0.5 mm to 1.0 mm can be observed. Further, the thickness of the sheath region may be several times (e.g., 5-10 times) the Debye length which is less than $10^{-4}$ m (0.1 mm) or less under typical surface treatment conditions. In any event, the sheath is important to plasma surface processing.

Figure 13B:
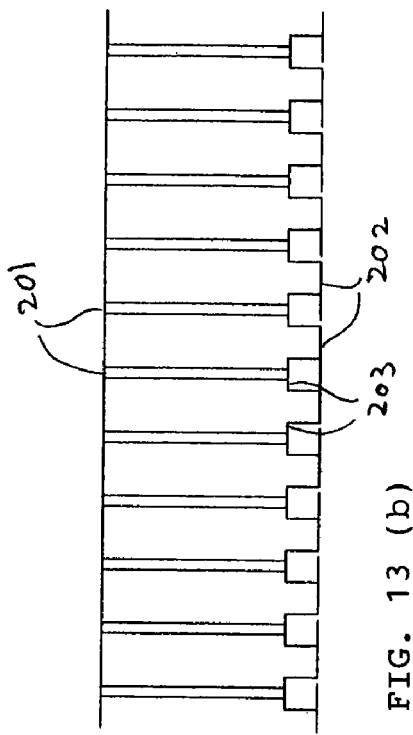
FIGS. 13(*a*)-(*c*) show an embodiment of a shower plate used in the plasma CVD apparatus shown in FIG. 1.
Figure 13C:
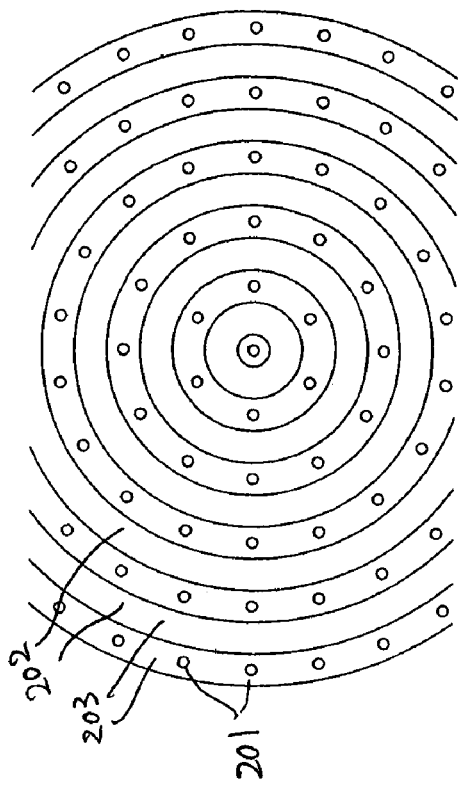
Figure 13A:
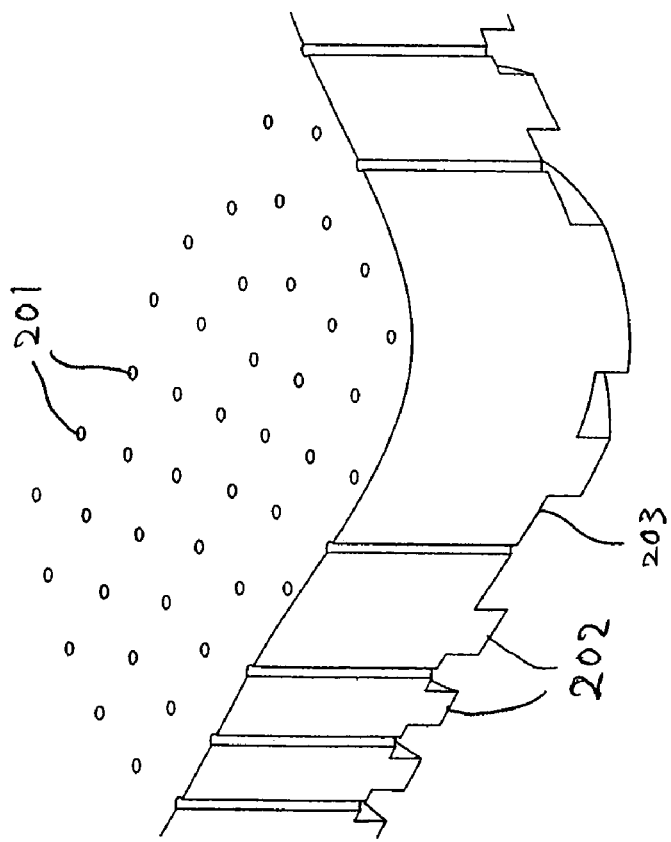
Figure 14:
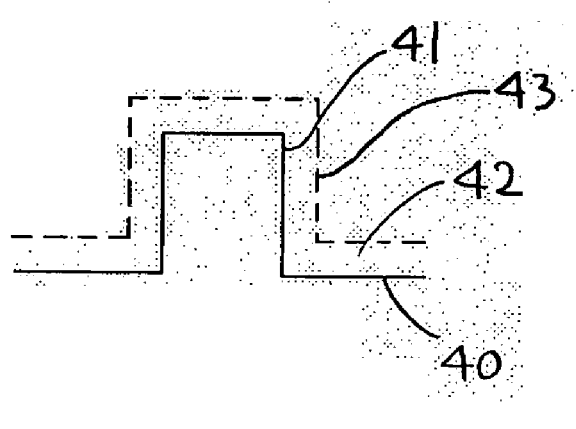
FIG. 14(*a*) is a schematic diagram explaining an increase of surface area with a sheath formed on a convex structure.
Figure 14:
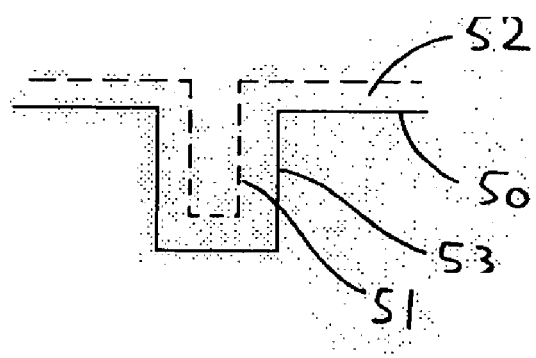
Figure 15:
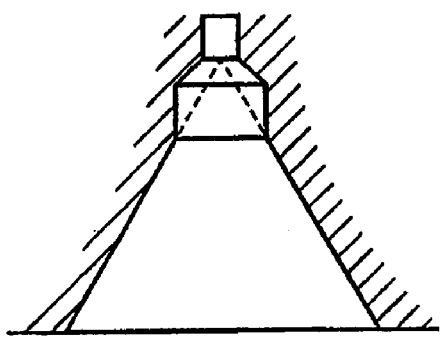
FIGS. 15(*a*)-(*b*) are cross sections, respectively, showing gas inlet holes formed in a shower plate of the related art.
Figure 15:
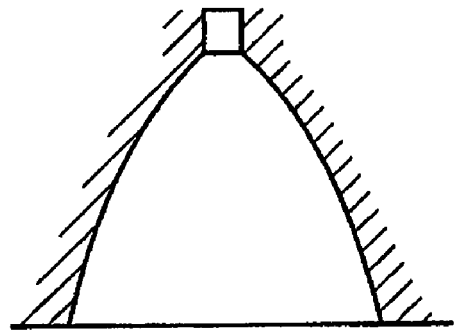
Figure 16:
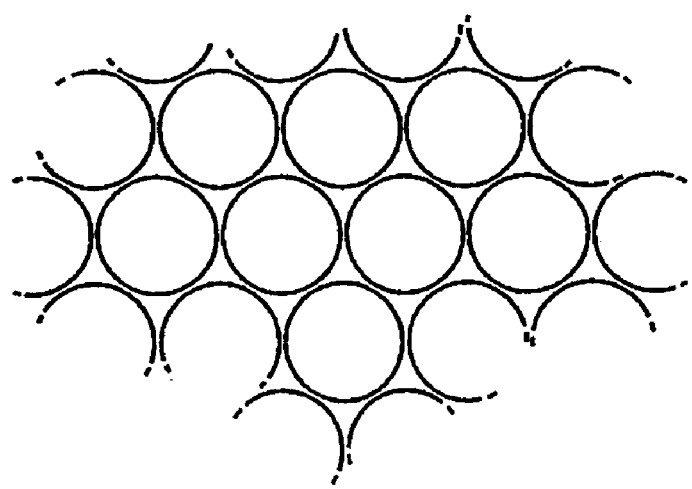
FIG. 16 is a bottom view of the shower plate shown in FIG. 15(*a*) or (*b*).

FIGS. 14(*a*) and (*b*) are schematic diagrams explaining an increase of surface area with a sheath formed on a convex structure and a sheath formed on a concave structure, respectively. The difference between the surface area of a physical surface 40, 50 and the surface area of a sheath 42, 52 is attributed to a difference between the surface are of a side portion 41, 51 of the physical surface and the surface area of a side portion 43, 53 of the sheath. The surface area of a horizontal portion is unchanged. For example, if the protrusion is a hexagonal column, the surface area of the side portion is calculated by the equation of the width (a distance between opposing side surfaces)×tan 30°×6 faces×height. In FIG. 14(*a*), when a sheath is formed, the outer width increases, thereby increasing the surface are of the side portion. In contrast, in FIG. 14(*b*), the inner width decreases, thereby decreasing the surface area of the side portion. Thus, the convex structure is preferred to the concave structure. When the convex structure is constituted by multiple concentric rings such as those indicated in FIGS. 13(*a*)-(*c*), the surface are of the side portions nearly or substantially remains the same (this is because this structure can be considered to be a concave structure). In any event, as long as the structure is a convex structure, the surface area of the side portion of a sheath is nearly or substantially equal to or greater than that of the physical surface.

For example, if the protrusions are hexagonal columns having a height of 3-9 mm and a width of 3 mm and provided at a pitch of 6 mm, the physical surface area is increased by about 72% to about 216%. If the thickness of a sheath formed over the physical surface is 0.5 mm, the extended surface area is increased by about 97% to about 292%. If the thickness of a sheath formed over the physical surface is 1.0 mm, the extended surface area is increased by about 121% to about 365%.

In the above, the surface area increases in the case of convex structures as long as a sheath formed over one protrusion and another sheath formed over another protrusion do not merge, regardless of how thick the sheath actually is. If adjoining sheathes merge, a surface area no longer exists. Thus, a distance between adjoining protrusions is preferably greater than twice the thickness of a sheath. Typically, the thickness of a sheath may be about 0.5 mm to about 1.0 mm, and thus, a distance between adjoining protrusions may be about 1 mm or more (including 2 mm, 3 mm, 5 mm, 10, and any numbers therebetween). The sheath thickness approach is a theory and is not intended to limit the present invention.

In the above, the surface area of the physical surface increases, and the surface are of the sheath further increases, and it may contribute to excellent controllability or operability. Further, in at least one embodiment, the protrusions are discontinuous, and thus, a plasma may not be confined between the protrusions. When a plasma is confined to a concave portion in a structure such as those indicated in U.S. Pat. No. 4,854,263, the contour of the concave portion is transferred on a film depositing on a substrate. For example, a portion on the film corresponding to the concave portion tends to have a thickness greater than that of the remaining portion. This can be observed by eye (color difference can be observed) or can be determined by measuring the thickness of the film at several spots. The plasma confinement is a theory and is not intended to restrict the present invention.

The protrusions may comprise multiple truncated pyramids, prismatic columns, cones, or cylindrical columns or any other suitable shapes (e.g., FIGS. 2(a)-(c) and 3(a)-(c)). The protrusions may have an embankment shape (e.g., FIGS. 13(a)-(c)). In these figures, a base surface (e.g., 23, 23', 203) has multiple apertures (e.g., 21, 21', 201) for passing a gas therethrough, and multiple protrusions (e.g., 22, 22', 202) each separately protrude from the base surface and are dispersed among the apertures.

A width of each protrusion may be larger than a diameter of each aperture by about 5% to 1000% (including 10%, 20%, 50%, 100%, 500%, and any numbers therebetween), depending on the distribution pattern of the apertures and the protrusions. The width of each protrusion may be about 0.5 mm or more (including 1 mm, 2 mm, 3 mm, 5 mm, 10 mm, and any numbers therebetween) and a distance between adjoining protrusions is about 1 mm or more (including 2 mm, 3 mm, 5 mm, 10, and any numbers therebetween). The height of protrusions may be about 0.5 mm to 10.0 mm (including 1 mm, 2 mm, 3 mm, 5 mm, 7 mm, and any numbers therebetween, preferably 3 mm to 9 mm).

The number of the protrusions may be 4 to 5,000 (including 10, 50, 100, 500, 1,000, 2,000, 3,000, and any numbers therebetween), depending on the shape of the protrusion. When a column- or cone-type is used, the protrusions may be more than half the number of the apertures. In an embodiment, the number of the protrusions may be 1, 2, 3, or 4 times the number of the apertures. The number of apertures may be 1,000 to 5,000 (typically 3,200-4,200, in an embodiment, 1,900-3,000). The diameter of the aperture may be about 0.1 mm to 2.0 mm, typically 0.3 mm to 0.8 mm.

The distance between an aperture and a protrusion may be determined based on the above positional relationships. For example, when the distance between adjoining protrusions is 2 mm, and the diameter of an aperture is 0.8 mm, the distance from the periphery of the aperture to one of the protrusions is 0.6 mm. In an embodiment, such a distance is 0.6 mm or greater (including 0.8 mm, 1 mm, 1.5 mm, 2 mm, and any numbers therebetween).

In another embodiment, the present invention provides a shower plate for plasma CVD comprising: (i) a base surface; (ii) multiple protrusions protruding from the base surface, and (iii) multiple apertures for passing a gas therethrough dispersed on a front face constituted by the base surface and the protrusions, wherein a surface area of the base surface and the protrusions is greater by at least 40% than a calculated surface area of the base surface if no protrusions are provided, and wherein a surface area when extending from the base surface and the protrusions by a sheath generated by plasma exposure is nearly or substantially equal to or greater than the surface area of the base surface and the protrusions.

In the above, the apertures may not be provided in the base surface but can be provided in the protrusions (in top surfaces of the protrusions). Preferably, the apertures are dispersed on the base surface, and the protrusions are dispersed among the apertures. As long as a surface area when extending from the base surface and the protrusions by a sheath generated by plasma exposure is nearly or substantially equal to or greater than the surface area of the base surface and the protrusions, the protrusions can be formed integrally (multiple pieces are integrated such as multiple strands radically extending from a common center). Any elements in the previous embodiment can be used in this embodiment as long as application of such elements is feasible.

In another embodiment, the present invention provides a plasma CVD apparatus comprising: (a) a reaction chamber; (b) a showerhead provided in the chamber, which serves as an electrode and comprises any one of the shower plates of the foregoing and a body member to which the shower plate is attached; and (c) a susceptor provided in the chamber, which serves as another electrode and is disposed parallel to the shower plate. The shower plate can be installed in various types of plasma CVD apparatuses. The shower plate can be attached to a shower body using a fastening device such as screws, or can be formed integrally with a shower body. The shower plate can be made of aluminum or aluminum alloy, and can be surface-treated such as anodization (e.g., anodized oxide film).

In still another embodiment, the present invention provides a plasma CVD method comprising: (1) placing a substrate on a susceptor disposed parallel to any one of the shower plates of the foregoing; (2) introducing a reaction gas through the shower plate; (3) generating a plasma between the susceptor and the shower plate by applying radio-frequency energy therebetween, wherein a sheath is formed over the shower plate, wherein a surface area of the sheath is nearly or substantially equal to or greater than a physical surface area of the shower plate; and (4) depositing a film on the substrate.

In yet another embodiment, the present invention provides a plasma CVD method comprising: (1) placing a substrate on a susceptor disposed parallel to any one of the shower plates of the foregoing; (2) introducing a reaction gas through the shower plate; (3) generating a plasma between the susceptor and the shower plate by applying radio-frequency energy therebetween, wherein a sheath is formed over the shower plate, wherein a surface area of the sheath is nearly or substantially equal to or greater than a physical surface area of the shower plate; and (4) depositing a film on the substrate.

In the above, the film may be selected from the group consisting of silicon nitride, silicon oxide, silicon oxynitride, low-dielectric-constant fluorine-doped silicon oxide, and low-dielectric-constant carbon-doped silicon oxide films.

In all of the aforesaid embodiments, any element used in an embodiment can interchangeably be used in another embodiment unless such a replacement is not feasible or causes adverse effect. Further, the present invention can equally be applied to apparatuses and methods.

The present invention will be explained with reference to preferred embodiments. However, the preferred embodiments are not intended to limit the present invention. An embodiment of the present invention is described in detail below with reference to drawings attached.

FIG. 1 shows a schematic view of one embodiment of the plasma CVD apparatus according to the present invention. This plasma CVD apparatus 10 comprises a vacuum (reaction) chamber 11, a first electrode 12 being provided at the top of the vacuum chamber 11 and insulated from the vacuum chamber 11, a second electrode 13 being provided inside the vacuum chamber 11 substantially parallel to the first electrode 12, and RF power sources 14 and 15 connected to the first electrode.

The vacuum chamber 11 has an opening at its lower portion and comprises an exhaust port 111 connected to an exhaust pump not shown. Additionally, the vacuum chamber 11 is grounded.

The first electrode 12 has a hollow structure, and an upper tubular portion comprises a gas inlet port 121 connected to a gas line (not shown). Additionally, on a bottom face of the first electrode, a shower plate 122 is removably attached. In the shower plate 122, many gas inlet holes (pores) are formed so that a jet of a source gas introduced from the gas inlet port 121 is emitted from the holes toward the second electrode 13. Additionally, on the front face of the shower plate 122 (the undersurface of the shower plate 122 in FIG. 1), protrusions described in detail later are formed. By removably attaching the shower plate 122, maintenance becomes easier and part replacement-related costs can be curtailed.

The second electrode 13 has a heater 131 and a susceptor 132 provided thereon. The susceptor 132 is disposed substantially parallel to the shower plate 122 and holds a workpiece 16 being placed on its upper surface.

A method for forming a thin film on a workpiece using the plasma CVD apparatus shown in FIG. 1 is described in detail below, although the present invention is not limited thereto.

In at least one embodiment, first, the workpiece 16 is placed on the susceptor 132. Inside the vacuum chamber 11 is evacuated to a given pressure by an exhaust pump connected to the exhaust port 111.

The workpiece is heated to a given temperature (e.g., 150-450° C.) by the heater 131, and is kept at the given temperature.

A source gas is introduced from the gas inlet port 112 into the vacuum chamber 11, and at the same time, RF voltage is applied to the first electrode 12 using the RF power source 14. If necessary, RF voltage from the second RF power source 15 is applied to the first electrode 12 by overlaying it on another. The second electrode 13 is grounded, or a given bias voltage is applied. As a result, discharge occurs between the first electrode 12 and the second electrode 13, and the source gas goes into the plasma state. Thus, a plasma reaction field is formed in the vicinity of the workpiece 16, and a thin film is formed on a surface of the workpiece 16.

A type and properties of a thin film formed on the surface of the workpiece 16 depend on a type and flow rate of a source gas, a temperature of a workpiece, a frequency and swing of RF voltage supplied from RF power sources 14 and 15, plasma spatial distribution and electric potential distribution.

In order to form silicon nitride films, silane may be used as a silicon-containing source gas, and nitrogen and/or ammonia may be used as a nitriding gas. In order to form silicon oxide films (USG: Undoped Silicate Glass films), silane or TEOS (tetra-ethyl-ortho-silicate) may be used as a silicon-containing source gas; as an oxidized gas, nitrous oxide may be used when silane is used, or oxygen may be used when TEOS is used. In order to form B (boron)-doped silicon oxide films (BSG: Boro-Silicate Grass films), in addition to a source gas used for the silicon oxide films, diborane may be used as a doping gas. In order to form P (phosphorus)-doped silicon oxide films (PSG: Phospho-Silicate Grass films), in addition to a source gas used for the silicon oxide films, phosphine may be used as a doping gas. In order to form B and P-doped silicon oxide films (BPSG: Boro-Phospho Silicate Grass films), in addition to a source gas used for the silicon oxide films, both diborane and phosphine may be used. In order to form silicon oxynitride films, silane may be used as a silicon-containing source gas, nitrogen and/or ammonia as a nitriding gas, and nitrous oxide may be used as oxidized gas. In order to form low-dielectric-constant fluorine-doped silicon oxide films, TEOS/oxygen/$CF_4$-containing gas, or silane/nitrous oxide/$SiF_4$-containing gas, etc. may be used. In order to form low-dielectric-constant carbon-doped silicon oxide films, silicon-containing hydrocarbon having multiple alkoxy groups and Ar (argon), and/or He (helium) may be used. According to circumstances, oxygen, nitrous oxide, carbon dioxide or alcohol, etc. may be used.

In order to control plasma spatial distribution and electric potential distribution inside the vacuum chamber 11, protrusions are formed on the front face of the shower plate 122.

Figure 2:
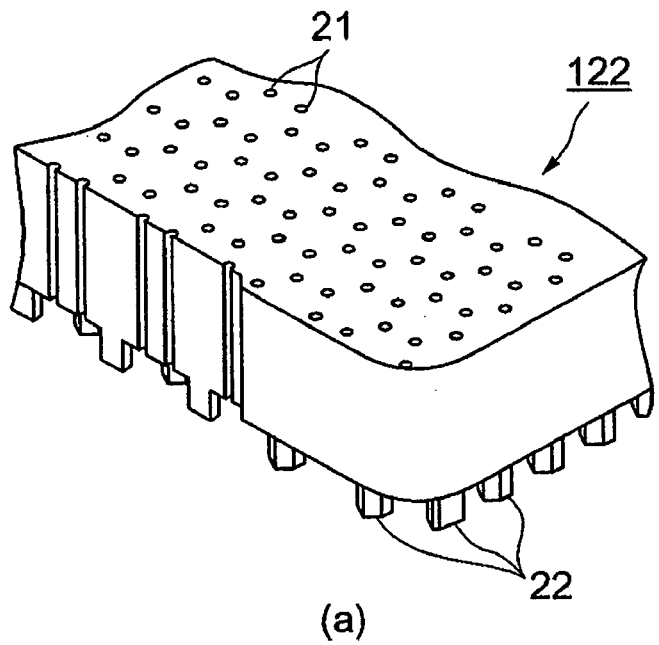
FIGS. 2(a)-(c) show an embodiment of a shower plate used in the plasma CVD apparatus shown in FIG. 1.
Figure 2:
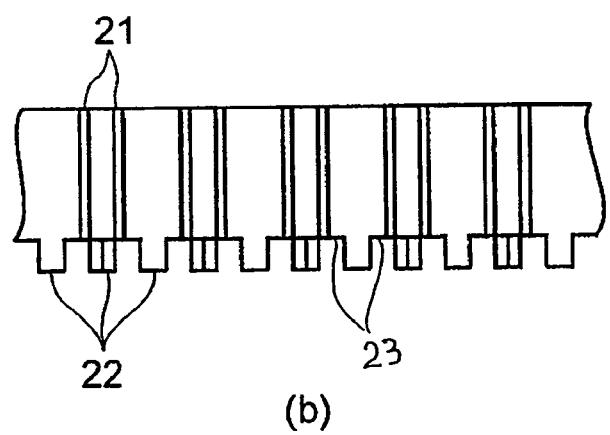
Figure 2:
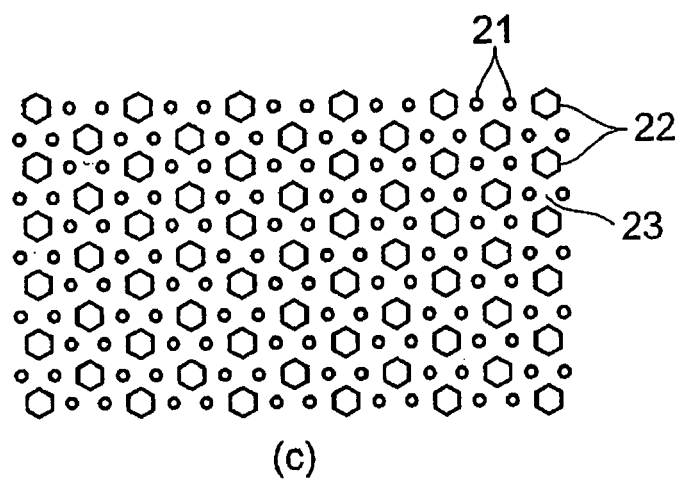

FIGS. 2(a)-(c) show one example of the shower plate 122. FIGS. 2 (a)-(c) are a partial cross section seen from obliquely upward, a partial longitudinal cross section, and a partial bottom view, respectively, showing the shower plate 122. Additionally, the shower plate 122 is normally disk-shaped.

As shown in FIGS. 2(a) and (b), the reverse face (the upper surface in the figures) of the shower plate 122 is a plane surface, and many gas inlet holes (pores) 21 reaching the front face (the undersurface in the figures) are formed with an arrangement. Additionally, in the front face (the undersurface in the figures) of the shower plate 122, many protrusions 22 are formed with an arrangement. Protrusions 22 are disposed so as to avoid pores 21 (so as to be apart from the pores 21 at a given distance). Therefore, the plane-surface portion 23 exists surrounding the pores 21. In other words, the protrusions 22 are formed so as to protrude downward from the plane-surface portion 23 surrounding the pores 21.

A size (an aperture diameter) and arrangement of the pores 21 are determined so as to non-formalize a distribution of a source gas introduced into the vacuum chamber (at least in the vicinity of the upper surface of a workpiece). Additionally, according to a size and arrangement of the pores 21 determined, a shape, size and arrangement of protrusions 22 can be determined so as to achieve uniform plasma spatial distribution and electric potential distribution. A size and arrangement of the pores 21 and a shape, size and arrangement of the protrusions 22 are not limited to those shown in FIGS. 2(a)-(c), and may be changed appropriately. For example, they can be changed to those shown in FIGS. 3(a), (b), and (c).

Protrusions 22 shown in FIGS. 2(a)-(c) are hexagonal-column-shaped; protrusions 22' shown in FIGS. 3(a)-(c) are truncated-pyramid-shaped. These shapes are used because forming them by machine work is easy; other shapes, e.g., cylindrical, conical, hemispheric, etc. can also be used. Additionally, a shape can be any polyangular column shapes or any polyangular pyramid shapes. Furthermore, multiple protrusions having an embankment shape (a mesa shape) of a given width may also be used by disposing them parallel, by a lattice-like arrangement, or concentrically. Additionally, angular portions may be chamfered.

A diameter of the protrusion 22 (22') may be larger than a diameter of the pore 21 (21'). In other words, a base area of respective protrusions 22 (22') may be larger than an area of a circle of diameter 1 mm. Additionally, a distance between adjoining protrusions 22 should be twice or more a sheath thickness, e.g., 2 mm or more, so as to generate plasma between the protrusions. As to a length of the protrusion 22, although approximately twice its diameter may be machine work limits when it is formed by machine work, the length should be, e.g., 0.5 mm or longer. As to the number of protrusions 22, ¼ or more the number of gas inlet pores is preferable; ½ or more is more preferable.

In the cases of protrusions having shapes shown in FIGS. 2(a)-(c) and FIGS. 3(a)-(c) respectively, they are formed in the same way as the above-mentioned. However, in the case of a protrusion having an embankment shape, the number of the protrusions may substantially be less than the number of the gas inlet holes 22.

By forming protrusions 22 (22', etc.) on the front face of the shower plate 122, its surface area, particularly its surface area with sheath taken into consideration, is increased; and plasma is formed between adjoining protrusions 22 as well. It may not mean that plasma being formed between adjoining protrusions 22 is remarkably stronger than plasma being formed in other areas, but it may mean that plasma spatial distribution is improved by plasma being formed between adjoining protrusions 22 as compared with the related art. As a result, for example, when a silicon nitride film is formed, controllability over internal stress of a film formed can be improved as compared with the related art; hence both improved controllability and decreased hydrogen concentration in the film can be achieved. Additionally, by an increased surface area of the shower plate 122, electric potential distribution can be improved and DC voltage Vdc and power source peak voltage Vpp applied to the first electrode 12 can be lowered. As a result, occurrence of abnormal discharge can be suppressed; hence damage to the first electrode and plasma damage to workpieces can be prevented or decreased. For example, when a low-dielectric-constant carbon-doped silicon oxide film is formed, with the related art, abnormal discharge occurred relatively frequently because high RF power is applied. In the plasma CVD apparatus according to this embodiment, occurrence of abnormal discharge is hardly seen.

Additionally, although, in at least one embodiment, the shower plate is removably attached, a shower plate may be formed as one with the first electrode or may be fixed with the first electrode.

The present invention will be explained by examples. However, the present invention is not limited to the examples.

Example 1

Thin film formation was conducted using the plasma CVD apparatus comprising the shower plate 22 shown in FIG. 2; and properties of thin films formed were measured (Examples 1-1 to 1-5). Additionally, as comparative examples, thin film formation was conducted using a plasma CVD apparatus comprising a shower plate similar to the shower plate described in U.S. Pat. No. 4,854,263; and properties of a thin film formed were measured. Specifications of the shower plates used are shown in Table 1 below. In Table 1, a rate of surface area increase is a rate of surface area increase as against a surface area of a tabular shower plate without protrusions or concave portions.

TABLE 1

|  | Example 1 | Comparative Example |
|---|---|---|
| Configuration | Hexagonal column | Concave |
| Height/depth | 3.7 mm | 3.8 mm |
| Width (face to face)/diameter | 3 mm | 3 mm |
| Pitch | 6 mm | 4.2 mm |
| The number | 2,233 | 4,005 |

TABLE 1-continued

|  | Example 1 | Comparative Example |
|---|---|---|
| Increase of surface area | | |
| Actual surface area | 89.8% | 152.8% |
| 0.5 mm sheath considered | 119.8% | 101.1% |
| 1.0 mm sheath considered | 149.7% | 50.6% |

Example 1-1

Film type: Low-deposition-rate silicon nitride film (Deposition rate<200 nm/min. (e.g., 160-190 nm/min.))

Deposition Conditions:

Source gas 1: Silane (50-150 sccm, preferably 65-95 sccm)

Source gas 2: Ammonia (20-80 sccm, preferably 25-60 sccm)

Source gas 3: Nitrogen (5000-10000 sccm, preferably 7,500-10,000 sccm)

First RF power source (HRF): 13.56 MHz (1-1.5 W/cm$^2$—Anode reference)

Second RF power source (LRF): 400 kHz (0 W/cm$^2$)

Pressure: 450-600 Pa (preferably 465-560 Pa)

Temperature: 300-400° C. (preferably 380-400° C.)

Workpiece: Diameter 300 mm silicon substrate

Cleaning frequency: Single wafer

Figure 4:
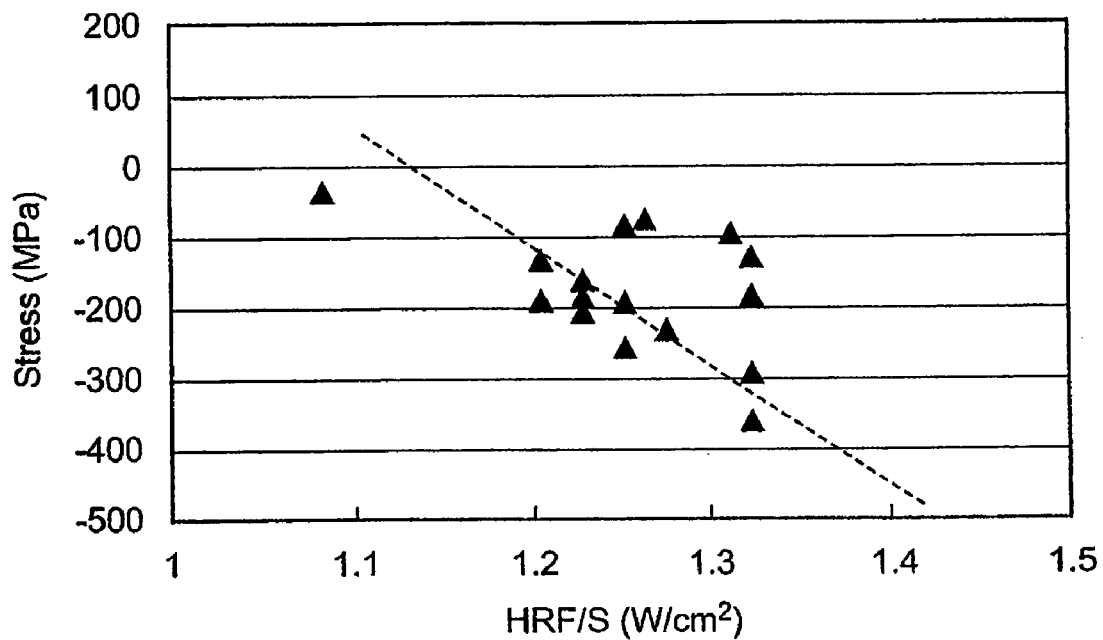
FIG. 4 is a graph showing properties (internal stress vs. high RF output) of a film formed by Example 1-1 of the present invention.
Figure 5:
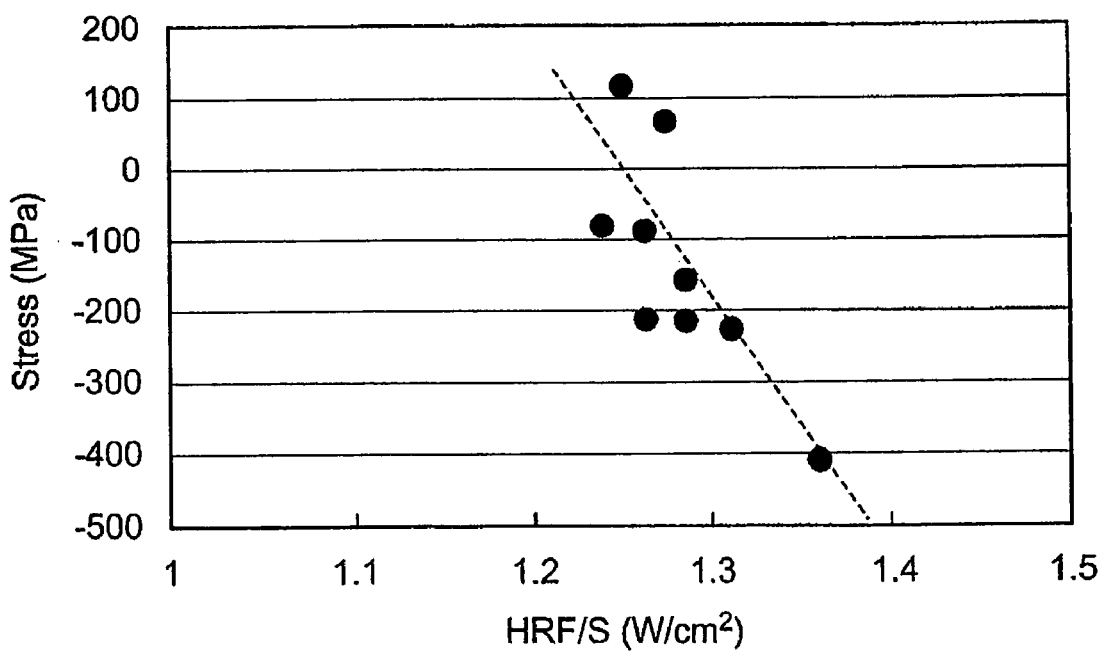
FIG. 5 is a graph showing properties (internal stress vs. high RF output) of a film formed by the related art.

Under the above-mentioned conditions, measurement results of properties of a thin film formed using the shower plate according to this embodiment of the present invention are shown in FIG. 4; measurement results of properties of a thin film formed using the shower head according to the related art are shown in FIG. 5.

When a low-deposition-rate silicon nitride thin film is formed, a desired value for the film's internal stress is about −100 MPa to about −200 MPa. When measurement results in FIG. 4 and FIG. 5 are compared, it is seen that using the shower plate according to this embodiment of the present invention, there was less change in the film's internal stress as against change in the output power of the first RF power source; hence control of the inner stress is easier.

Additionally, using the Fourier transform infrared spectroscopy, peak areas of Si—H bonds (in the neighborhood of 2100 cm$^{-1}$), N—H bonds (in the neighborhood of 3300 cm$^{-1}$) and Si—N bonds (in the neighborhood of 800 cm$^{-1}$) are obtained; using the ratio obtained, evaluation of hydrogen concentration in the films was performed, i.e., Si—H (%)=(Si—H bond peak area/Si—N bond peak area)×100%, N—H (%)=(N—H bond peak area/Si—N bond peak area)×100% were obtained. As a result, it was confirmed that the hydrogen concentration in the film of the thin film formed using the shower plate according this embodiment of the present invention was Si—H<2% (about 1.8%).

Low-deposition-rate silicon nitride films are desired to comprise both internal stress of about −100 MPa to about −200 MPa and low hydrogen concentration in the film (Si—H<2% (about 1.8%)). As described above, forming a film possessing both desired properties was achieved using the shower plate according this embodiment of the present invention.

Additionally, in the comparative example, it was found that a surface pattern of the first electrode had been transferred to a thickness distribution of the film formed. In other words, film thickness was not uniform.

Example 1-2

Figure 6:
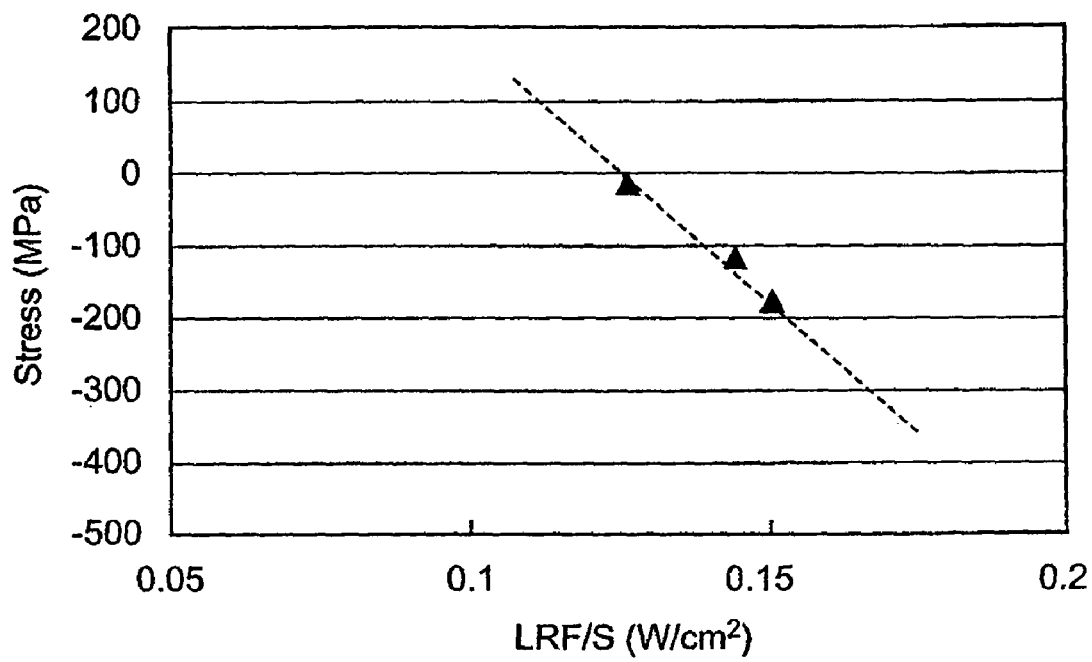
FIG. 6 is a graph showing properties (internal stress vs. low RF output) of a film formed by Example 1-2 of the present invention.
Figure 7:
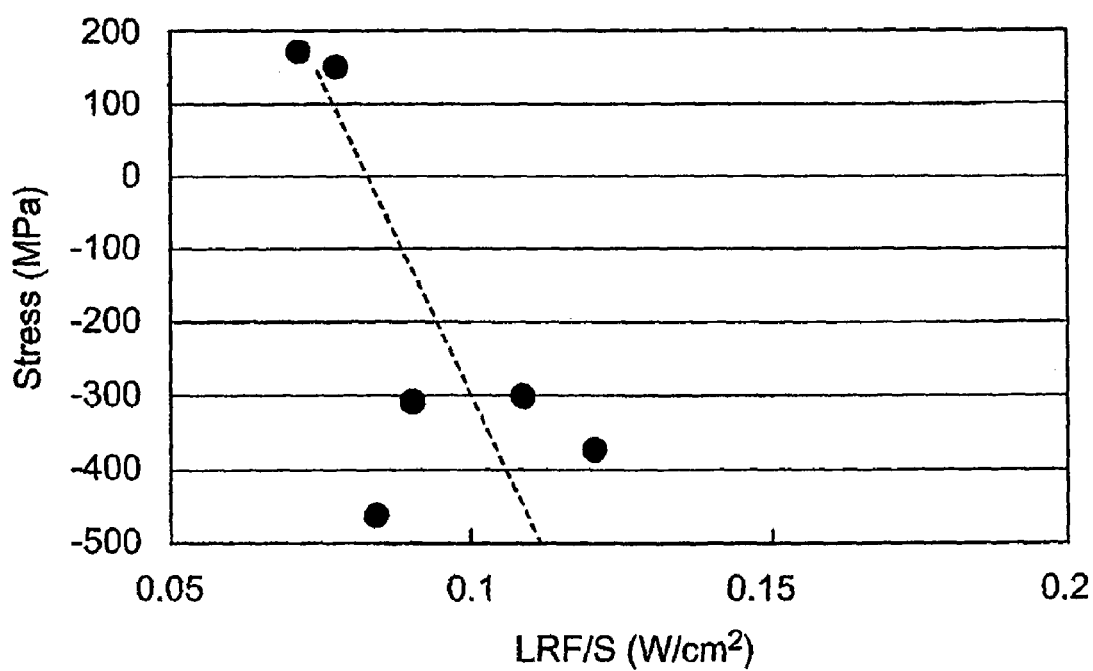
FIG. 7 is a graph showing properties (internal stress vs. low RF output) of a film formed by the related art.

Film type: Low-deposition-rate silicon nitride thin film (Deposition rate<200 nm/min. (e.g., 160-190 nm/min.))
Deposition Conditions:
Source gas 1: Silane (50-150 sccm, preferably 65-95 sccm)
Source gas 2: Ammonia (20-80 sccm, preferably 25-60 sccm)
Source gas 3: Nitrogen (5000-10000 sccm, preferably 7,500-10,000 sccm)
First RF power source (HRF): 13.56 MHz (0.72 W/cm$^2$ fixed—Anode reference)
Second RF power source (LRF): 400 kHz (0.05-0.2 W/cm$^2$—Anode reference)
Pressure: 450-600 Pa (preferably 465-560 Pa)
Temperature: 300-400° C. (preferably 380-400° C.)
Workpiece: Diameter 300 mm silicon substrate
Cleaning frequency: Single wafer In this example, except that output of the first RF power source was fixed and that output of the second RF power source was changed, the same conditions as used for Example 1-1 were used. Under the above-mentioned conditions, measurement results of properties of a thin film formed using the shower plate according to this embodiment of the present invention are shown in FIG. 6; measurement results of properties of a thin film formed using the shower head according to the related art are shown in FIG. 7.

As mentioned in Example 1-1 as well, when a low-deposition-rate silicon nitride thin film is formed, a desired value of the film's internal stress is about −100 MPa to about −200 MPa. When the measurement results shown in FIG. 6 and FIG. 7 are compared, it is seen that using the shower plate according to this embodiment of the present invention, there was less change in the film's internal stress as against change in the output power of the second RF power source; hence control of the inner stress is easier.

Low-deposition-rate silicon nitride thin films are desired to comprise both internal stress of about −100 MPa to about −200 MPa and low hydrogen concentration in the film (Si—H<2% (about 1.8%)). Using the shower plate according this embodiment of the present invention, it was confirmed by the separate measurement result that forming a film possessing both desired properties was achieved.

Additionally, in the comparative example, it was found that a surface pattern of the first electrode had been transferred to a thickness distribution of the film formed. In other words, film thickness was not uniform.

Example 1-3

Figure 8:
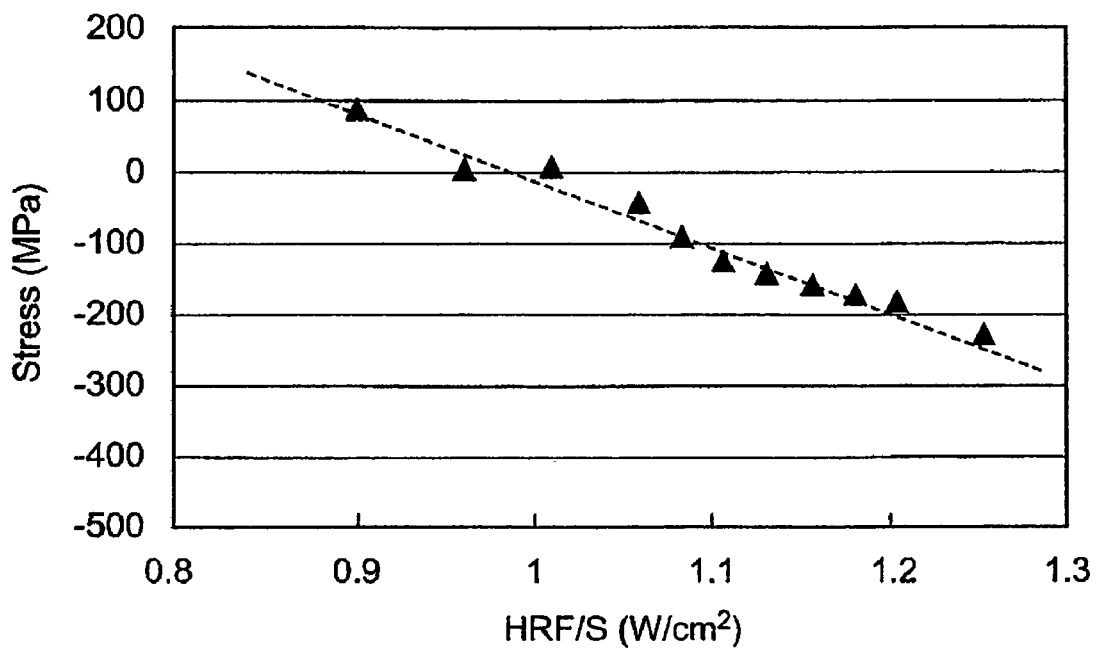
FIG. 8 is a graph showing properties (internal stress vs. high RF output) of a film formed by Example 1-3 of the present invention.
Figure 9:
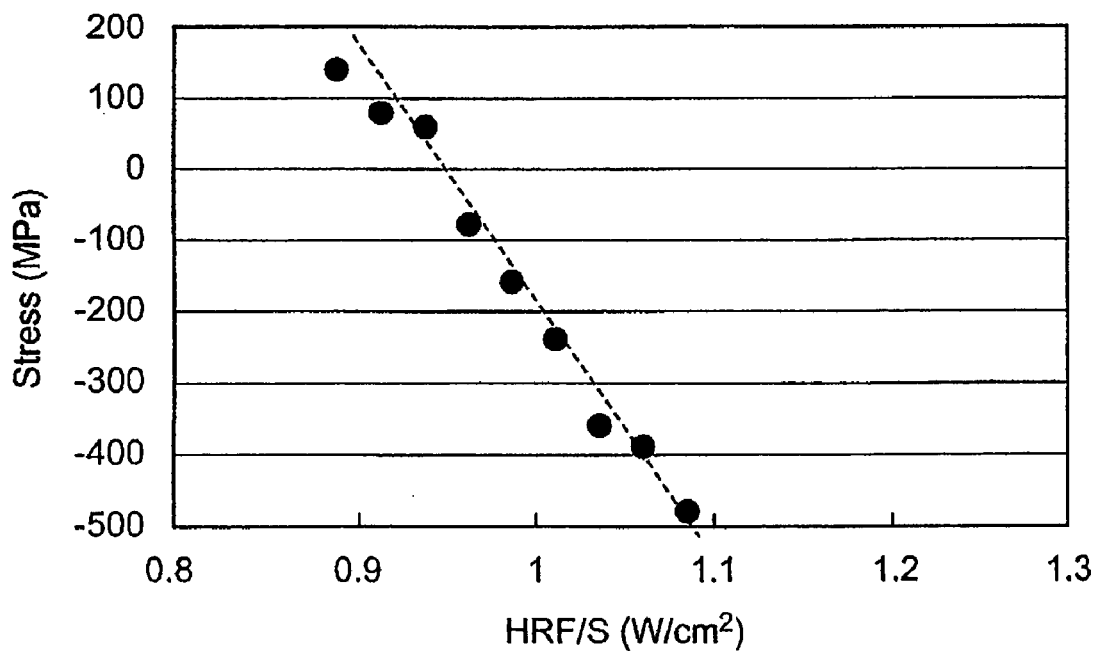
FIG. 9 is a graph showing properties (internal stress vs. high RF output) of a film formed by the related art.

Film type: High-deposition-rate silicon nitride thin film (Deposition rate<500 nm/min. (e.g., 550-650 nm/min.))
Deposition Conditions:
Source gas 1: Silane (300-500 sccm, preferably 360-440 sccm)
Source gas 2: Ammonia (2000-3000 sccm)
Source gas 3: Nitrogen (500-2500 sccm)
First RF power source (HRF): 13.56 MHz (0.8-1.3 W/cm$^2$—Anode reference)
Second RF power source (LRF): 400 kHz (0.5 W/cm$^2$ fixed—Anode reference)
Pressure: 450-600 Pa (preferably 465-560 Pa)
Temperature: 300-400° C. (preferably 380-400° C.)
Workpiece: Diameter 300 mm silicon substrate
Cleaning frequency: Single wafer Under the above-mentioned conditions, measurement results of properties of a thin film formed using the shower plate according to this embodiment of the present invention are shown in FIG. 8; measurement results of properties of a thin film formed using the shower head according to the related art are shown in FIG. 9.

When high-deposition-rate silicon nitride films are formed as well, similarly to low-deposition-rate silicon nitride films, a desired value of the films' internal stress is about −100 MPa to about −200 MPa. When measurement results in FIG. 8 and FIG. 9 are compared, it is seen that using the shower plate according this embodiment of the present invention, there was less change in the film's internal stress as against change in the output power of the first RF power source; hence control of the inner stress is easier.

High-deposition-rate silicon nitride thin films are desired to comprise both internal stress of about −100 MPa to about −200 MPa and low hydrogen concentration in the film (Si—H<5% (e.g., 3.5-4.8%)). Using the shower plate according this embodiment of the present invention, it was confirmed by the separate measurement result that forming a film possessing both desired properties was achieved.

Additionally, in the comparative example, it was found that a surface pattern of the first electrode had been transferred to a thickness distribution of the film formed (observed by eye). In other words, film thickness was not uniform.

Example 1-4

Film type: Low-dielectric-constant C-doped silicon oxide film
Deposition Conditions:
Source gas: DM-DMOS (Dimethyl-dimethoxysilane) (200 sccm)
Additive gas: He (400 sccm)
First RF power source (HRF): 27.12 MHz (3.0 W/cm$^2$—Anode reference)
Second RF power source (LRF): 400 kHz (0.1 W/cm$^2$—Anode reference)
Pressure: 450-600 Pa (preferably 465-560 Pa)
Temperature: 300-400° C. (preferably 380-400° C.)
Workpiece: Diameter 300 mm silicon substrate
Cleaning frequency: Single wafer Under the above-mentioned conditions, film deposition was conducted on 100 pieces of silicon substrates consecutively. Under the above-mentioned conditions, abnormal discharge frequently occurs if a tabular shower plate is used. Using the shower plate according to this embodiment of the present invention, abnormal discharge never occurred.

Additionally, in the comparative example, it was found that a surface pattern of the first electrode had been transferred to a thickness distribution of the film formed (observed by eye). In other words, film thickness was not uniform.

Example 1-5

Film type: Silicon oxide films (USG, BPSG, PSG, BSG), silicon oxynitride film, low-dielectric-constant F-doped silicon oxide film It was confirmed that using the shower plate according to this embodiment of the present invention, respective thin films were able to be formed without problems. As film deposition conditions for these film types are relatively loose (e.g., 13.56 MHz, 0.5 W/cm$^2$—Anode reference) and these films' parameter-dependence is low, there was no remarkable difference observed between the films formed using the shower plate according to this embodiment of the present invention and the films formed using the shower plate of the related art.

Example 2

Figure 3:
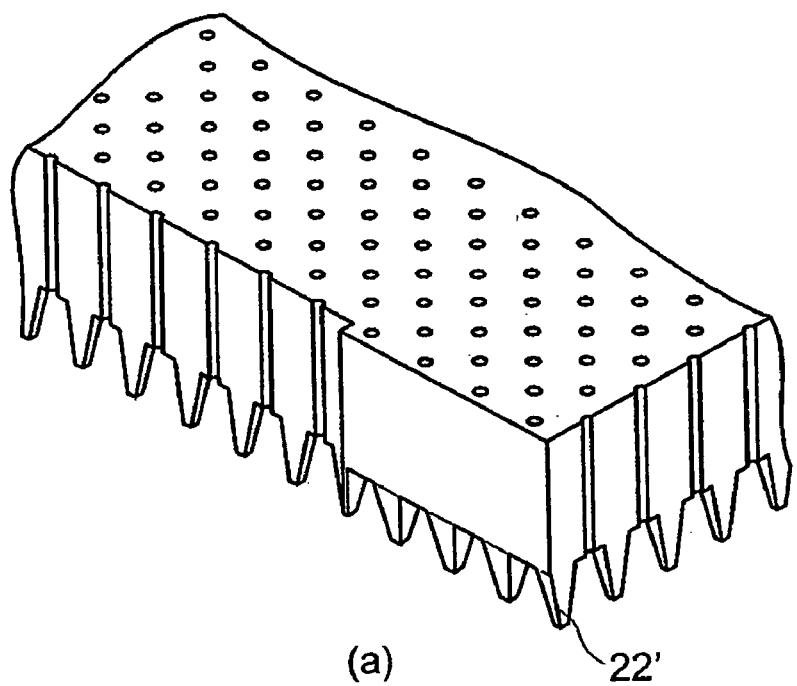
FIGS. 3(a)-(c) show another embodiment of a shower plate used in the plasma CVD apparatus shown in FIG. 1.
Figure 3:
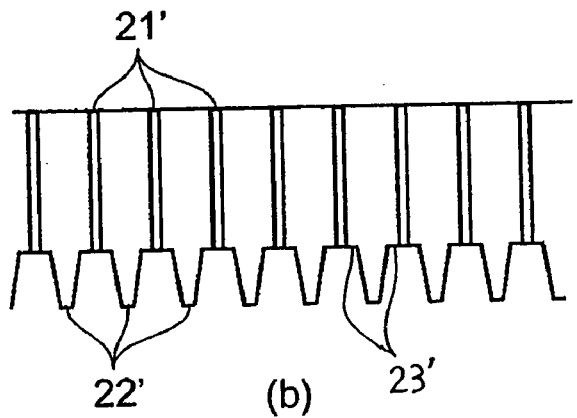
Figure 3:
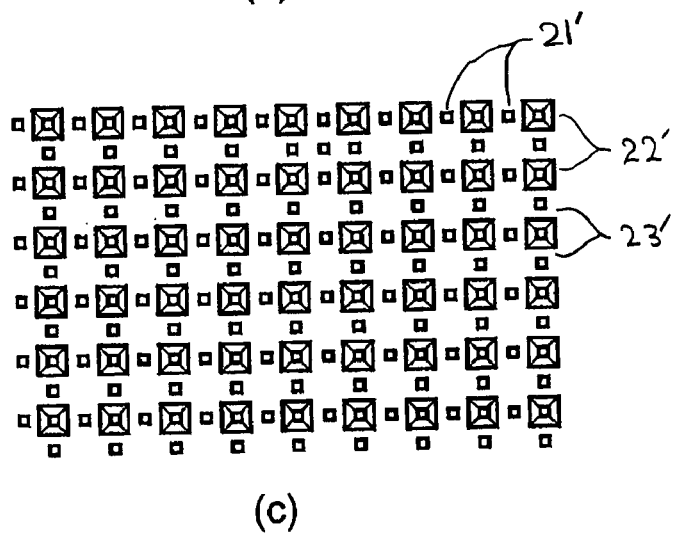

Using a plasma CVD apparatus comprising the shower plate 22' shown in FIG. 3, film deposition was conducted, and properties of the films formed were measured (Examples 2-1 to 2-5). Specifications of the shower plate used are shown in Table 2 below.

TABLE 2

|  | Example 2 |
| --- | --- |
| Configuration | Truncated pyramid (four-sided) |
| Height | 6 mm |
| Width (face to face) | 3 mm |
| Pitch | 6 mm |
| The number | 2,593 |
| Increase of surface area | |
| Actual surface area | 107.2% |
| 0.5 mm sheath considered | 153.6% |
| 1.0 mm sheath considered | 199.9% |

Example 2-1

Film type: Low-deposition-rate silicon nitride thin film (Deposition rate<200 nm/min. (e.g., 160-190 nm/min.))

Deposition conditions: The same as used in Example 1-1

Figure 10:
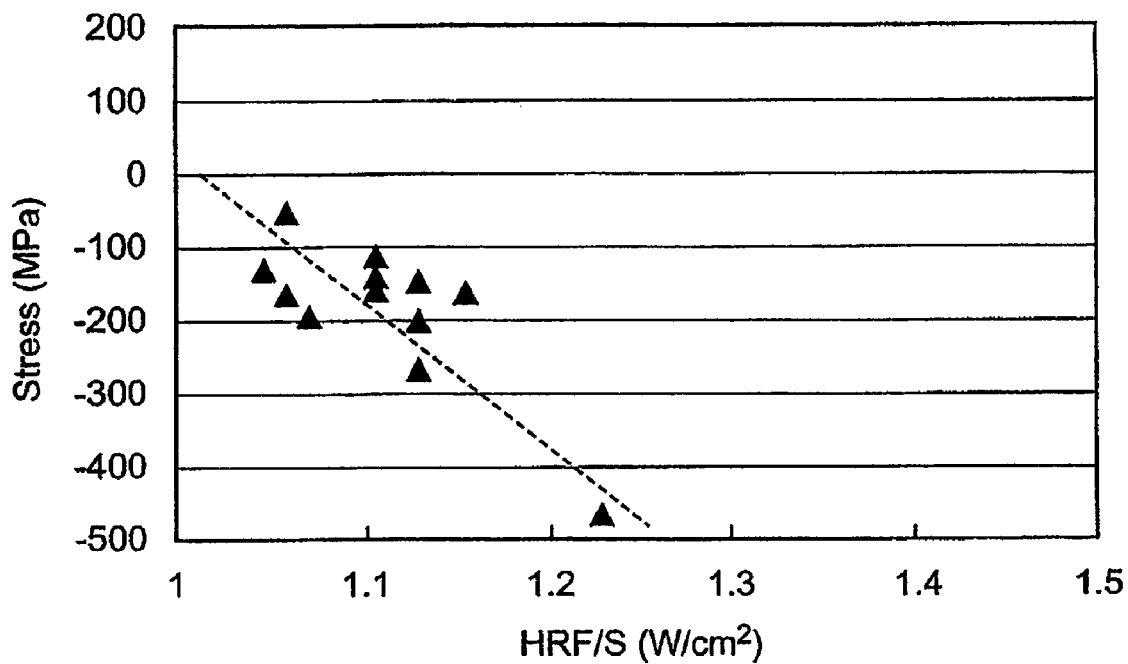
FIG. 10 is a graph showing properties (internal stress vs. high RF output) of a film formed by Example 2-1 of the present invention.

Properties of a film formed using the shower plate according to this embodiment of the present invention under the above-mentioned conditions were measured; measurement results are shown in FIG. 10. As is evident by comparison with the measurement results shown in FIG. 5, using the shower plate according to this embodiment of the present invention, there was less change in the film's internal stress as against change in the output power of the first RF power source; hence control of the inner stress is easier.

Additionally, as a result of evaluating hydrogen concentration in the film using the same method as used with Example 1-1, it was confirmed that the film's hydrogen concentration in the film was Si—H<2% (about 1.8%). In other words, using the shower plate according to this embodiment of the present invention as well, forming a film possessing both desired film properties for the low-deposition-rate silicon nitride thin film, which are the internal stress of about −100 MPa to about −200 MPa and low hydrogen concentration in the film (Si—H<2% (about 1.8%)), was achieved.

Example 2-2

Film type: Low-deposition-rate silicon nitride thin film (Deposition rate<200 nm/min. (e.g., 160-190 nm/min.))

Deposition conditions: The same as used in Example 1-2

Figure 11:
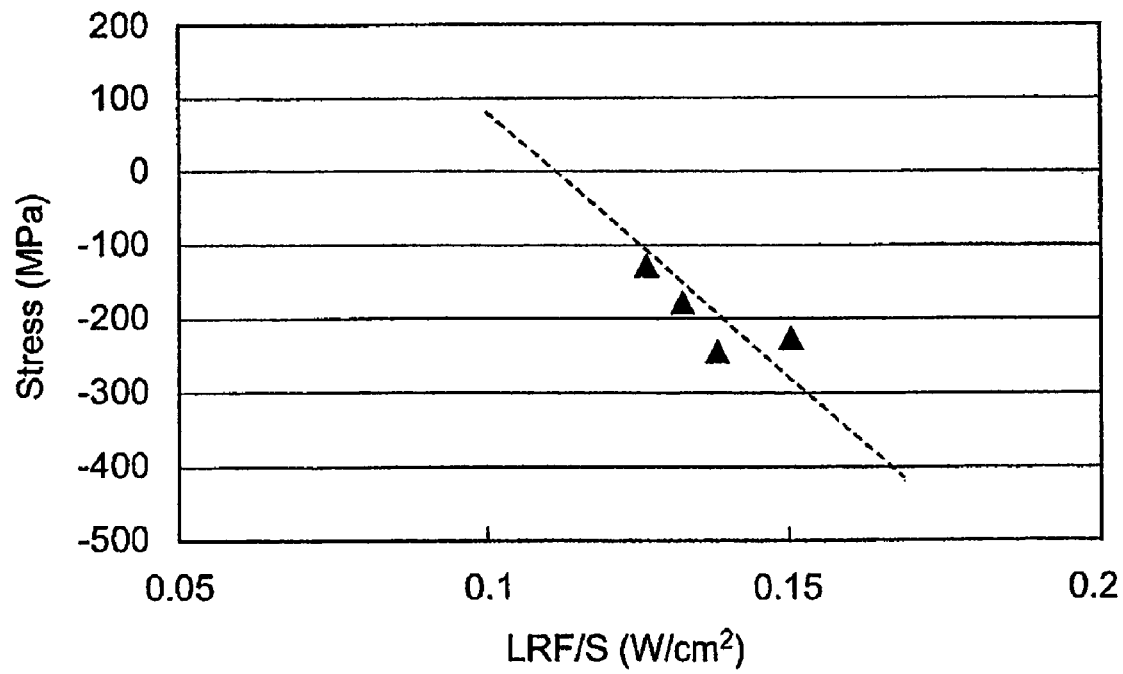
FIG. 11 is a graph showing properties (internal stress vs. low RF output) of a film formed by Example 2-2 of the present invention.

Properties of a film formed using the shower plate according to this embodiment of the present invention under the above-mentioned conditions were measured; measurement results are shown in FIG. 11.

In the same way as in Example 1-2, as compared with the measurement results shown in FIG. 7, it is seen that controllability is better than using the shower plate of the related art. Additionally, it was confirmed that forming a film possessing both internal stress of about −100 MPa to about −200 MPa and low hydrogen concentration in the film (Si—H<2% (about 1.8%)) was achieved by using the shower plate according to this embodiment of the present invention.

Example 2-3

Film type: High-deposition-rate silicon nitride thin film (Deposition rate<500 nm/min. (e.g., 550-650 nm/min.))

Deposition conditions: The same as used in Example 1-3

Figure 12:
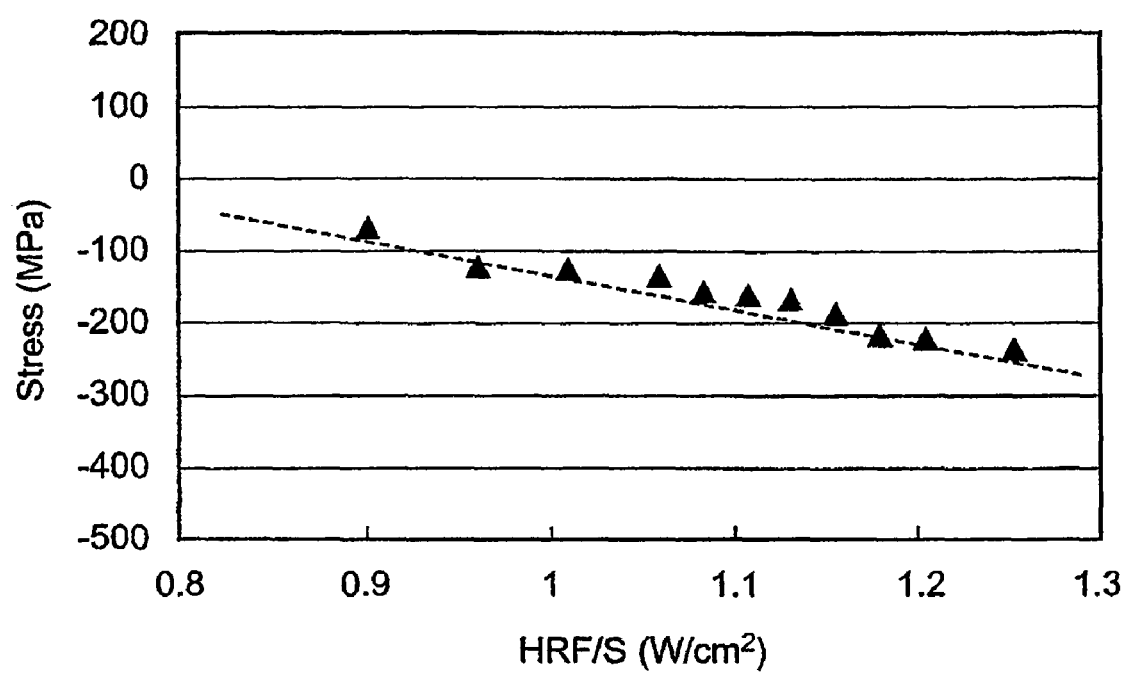
FIG. 12 is a graph showing properties (internal stress vs. high RF output) of a film formed by Example 2-3 of the present invention.

Properties of a film formed using the shower plate according to this embodiment of the present invention under the above-mentioned conditions were measured; measurement results are shown in FIG. 12.

As compared with the measurement results shown in FIG. 9, it is seen that controllability is better than using the shower plate of the related art.

Additionally, using the shower plate according to this embodiment of the present invention, it was confirmed that forming a film possessing both desired film properties for the high-deposition-rate silicon nitride thin film, which are the internal stress of about −100 MPa to about −200 MPa and low hydrogen concentration in the film (Si—H<5% (e.g., 3.5-4.8%)), was achieved.

Example 2-4

Film type: Low-dielectric-constant C-doped silicon oxide film

Deposition conditions: The same as used in Example 1-4

In the same way as was in Example 1-4, film deposition was conducted on 100 pieces of silicon substrates consecutively. Abnormal discharge never occurred.

Example 2-5

Film type: Silicon oxide films (USG, BPSG, PSG, BSG), silicon oxynitride film, low-dielectric-constant fluorine-doped silicon oxide film It was confirmed that using the shower plate according to this embodiment of the present invention, respective thin films were able to be formed without problems.

The present invention includes the above mentioned embodiments and other various embodiments including the following:

1) A shower plate having multiple gas inlet holes being formed with an arrangement and used in a plasma CVD apparatus, which is characterized in that a plane-surface portion surrounding apertures of multiple gas inlet holes and protrusions protruding from the plane-surface portion are formed on the front face of the shower plate.

2) A plasma CVD apparatus provided with a shower plate having multiple gas inlet holes being formed with an arrangement and used in a plasma CVD apparatus, which is characterized in that a plane-surface portion surrounding the apertures of multiple gas inlet holes and protrusions protruding from the plane-surface portion are formed on the front face of the shower plate.

3) A plasma CVD method for forming a thin film on a workpiece using a plasma CVD apparatus provided with a shower plate having multiple gas inlet holes being formed with an arrangement and used in a plasma CVD apparatus, which is characterized in that a plane-surface portion surrounding the apertures of multiple gas inlet holes and protrusions protruding from the plane-surface portion are formed on the front face of the shower plate, wherein the plasma CVD method is characterized by being adapted to form any one of silicon nitride, silicon oxide, silicon oxynitride, low-dielectric-constant fluorine-doped silicon oxide, and low-dielectric-constant carbon-doped silicon oxide films as the thin film by introducing source gases via the shower plate and by applying radio frequency power to the shower plate.

4) A thin film, which is characterized by having been formed on a workpiece using a plasma CVD apparatus provided with a shower plate having multiple gas inlet holes being formed with an arrangement and used in a plasma CVD apparatus which is characterized in that a plane-surface portion surrounding the apertures of multiple gas inlet holes and protrusions protruding from the plane-surface portion are formed on the front face of the shower plate, is obtained.

According to at least one of the above embodiments of the present invention, by forming a plane-surface portion surrounding the apertures of multiple gas inlet holes and protrusions protruding from the plane-surface portion on the front face of a shower plate, and using a plasma CVD apparatus using the shower plate, a thin film can be formed stably with excellent controllability.

The present application claims priority to Japanese Patent Application No. 2004-044854, filed Feb. 20, 2004, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A shower plate for a plasma CVD apparatus comprising a first electrode with a shower plate having a first face that faces a second electrode, wherein the first face of the shower plate includes:
   - an exterior base surface facing the second electrode and having multiple apertures for passing a gas therethrough, each aperture extending from the exterior base surface to a face other than the exterior base surface; and
   - multiple discontinuous protrusions each having the same size and separately protruding in a direction toward the second electrode and extending from the exterior base surface along the thickness direction of the shower plate and being dispersed among the apertures, wherein a tip of each protrusion faces the second electrode away from the exterior base surface having the apertures, a distance between any one of the protrusions and any one of the apertures adjacent to each other is smaller than a distance between the protrusion and any protrusion adjacent to the protrusion, the number of the apertures is greater than the number of the protrusions.

2. The shower plate according to claim 1, wherein a surface area of the base surface and the protrusions is greater by at least 40% than a calculated surface area of the base surface if no protrusions are provided.

3. The shower plate according to claim 1, wherein a surface area when extending from the base surface and the protrusions by a sheath generated by plasma exposure is nearly or substantially equal to or greater than the surface area of the base surface and the protrusions.

4. The shower plate according to claim 1, wherein the base surface is constituted by a plane surface.

5. The shower plate according to claim 1, wherein a width of each protrusion is larger than a diameter of each aperture.

6. The shower plate according to claim 1, wherein the width of each protrusion is about 1 mm or more and a distance between adjoining protrusions is about 2 mm or more.

7. The shower plate according to claim 1, wherein the number of the protrusions is more than half the number of the apertures.

8. The shower plate according to claim 1, wherein any one of the protrusions is equidistant from the apertures adjacent to the protrusion as viewed from above with reference to the base surface.

9. The shower plate according to claim 8, wherein each protrusion has protrusions adjacent to and equidistant from the protrusion and arranged at points of a hexagon or a quadrilateral as viewed from above with reference to the base surface.

10. The shower plate according to claim 8, wherein each protrusion has apertures adjacent to and equidistant from the protrusion and arranged at points of a hexagon or a quadrilateral as viewed from above with reference to the base surface.

11. The shower plate according to claim 8, wherein each protrusion has protrusions adjacent to and equidistant from the protrusion and arranged at points of a hexagon as viewed from above with reference to the base surface, and has apertures adjacent to and equidistant from the protrusion and arranged at points of a hexagon as viewed from above with reference to the base surface.

12. The shower plate according to claim 1, wherein the shower plate is made of anodized aluminum.

13. The shower plate according to claim 1, wherein the protrusions are made of multiple convex truncated pyramids, convex prismatic columns, or convex cones.

* * * * *